United States Patent
Van der Zaag et al.

(10) Patent No.: US 6,746,904 B2
(45) Date of Patent: Jun. 8, 2004

(54) ELECTRONIC DEVICES COMPRISING THIN FILM TRANSISTORS

(75) Inventors: Pieter J. Van der Zaag, Pyrford (GB); Steven C. Deane, Redhill (GB); Stephen J. Battersby, Haywards Heath (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/654,366

(22) Filed: Sep. 3, 2003

(65) Prior Publication Data

US 2004/0048423 A1 Mar. 11, 2004

Related U.S. Application Data

(63) Continuation of application No. 10/142,587, filed on May 9, 2002, now abandoned.

(30) Foreign Application Priority Data

May 10, 2001 (GB) ............................................. 0111424

(51) Int. Cl.[7] .............................................. H01L 21/00
(52) U.S. Cl. ...................................... 438/149; 438/949
(58) Field of Search .............................. 438/149, 151, 438/948, 949

(56) References Cited

U.S. PATENT DOCUMENTS

| 5,130,829 A | 7/1992 | Shannon | 359/59 |
| 6,414,164 B1 * | 7/2002 | Afzali-Ardakani et al. | 549/59 |
| 6,461,901 B1 * | 10/2002 | Noguchi | 438/158 |
| 6,504,175 B1 * | 1/2003 | Mei et al. | 257/66 |
| 6,576,536 B1 * | 6/2003 | Babcock | 438/585 |

OTHER PUBLICATIONS

Stanley Wolf Silicon Processing for the VSLI ERA vol. 1 Lattice Press 1986 pp. 452,468–471,480,501–502.*

John L. Vossen Thin Film Processes II Academic Press 1991 pp. 34–35.*

Excimer–Laser–Produced Amorphous Silicon Vertical thin Film Transistors by A. Saitoh et al, Jpn. J. Appl. Phys. vol. 36 (1997) pp. 668–9.

IBM Technical Disclosure Bulletin, vol. 29 No. 5, Oct. 1986, pp. 2224–6.

John L Vossen Thin Film Processes II Academic Press 1991 pp. 34–35.

* cited by examiner

*Primary Examiner*—Chandra Chaudhari
*Assistant Examiner*—David S. Blum

(57) ABSTRACT

The invention provides a method of manufacturing an electronic device including a vertical thin film transistor. A layer (8) of semiconductor material is provided over an insulated gate electrode (2). A negative resist (14) is used to define source and drain electrodes (26,28) which extend over the insulating layer (8) up to the step formed therein adjacent an edge (16A) of the gate electrode (2).

20 Claims, 3 Drawing Sheets

ELECTRONIC DEVICES COMPRISING THIN FILM TRANSISTORS

This is a continuation of U.S. patent Ser. No. 10/142,587, filed on May 9, 2002 now abandoned.

The present invention relates to the manufacture of electronic devices comprising thin film transistors (TFTs) on an insulating surface, for example, a glass or insulating polymer substrate. The device may be, for example, an active matrix liquid crystal display (AMLCD) or other flat panel display.

For many years there has been considerable interest in developing thin-film circuits with TFTs on glass and/or on other inexpensive insulating substrates, for large area electronics applications. Such TFTs fabricated with amorphous or polycrystalline semiconductor films may form the switching elements of a cell matrix, for example, on the active plate of a flat panel display as described in U.S. Pat. No. 5,130,829.

Typically, the TFTs used in the active plate of a display have a lateral configuration, in that the source and drain electrodes are spaced laterally relative to the underlying substrate. The distance between these electrodes, which defines the channel length of the TFT, is determined using lithographic techniques. A uniform layer of electrode material is deposited, then patterned using photolithography and etching. Such processes are expensive as the associated equipment is costly and has a low throughput, and use large quantities of photoresist and developer. They are also difficult to control accurately across a relatively large substrate, for example, when fabricating LCDs for television applications. In addition, lithographic equipment currently available for use in manufacture is only able to reliably provide a minimum channel length of around 5 microns over a relatively large substrate. Shorter channel lengths are desirable as they result in higher speed TFTs.

In a vertical TFT, the source and drain electrodes are spaced normally relative to the substrate and the size of this spacing is defined by the thickness of one or more layers of the TFT, rather than by using photolithography.

A vertical TFT configuration is described in "Excimer-Laser-Produced Amorphous Silicon Vertical Thin Film Transistors" by Akihiko Saitoh and Masakiyo Matsumura, Jpn. J. Appl. Phys. Vol. 36 (1997) pp668–9. The process used to fabricate the TFT disclosed in this paper defines source and drain regions without employing photolithography, by laser crystallisation of amorphous silicon. However, photolithography is subsequently used to define the source and drain electrodes.

It is an object of the invention to provide an improved method of manufacturing an electronic device including a vertical thin film transistor.

The present invention provides a method of manufacturing an electronic device including a thin film transistor, comprising the steps of:

(a) forming a gate electrode on an insulating surface;
(b) depositing an insulating layer over the gate electrode and a region adjacent an edge of the gate electrode, such that the insulating layer comprises two outer surfaces which are substantially parallel to, and mutually spaced normally of, the insulating surface with a step extending therebetween;
(c) depositing a layer of semiconductor material;
(d) depositing a layer of electrode material;
(e) depositing a layer of negative resist material over the electrode material layer, the resist material being soluble in a predetermined solvent;
(f) irradiating the resist layer to render exposed portions insoluble in the predetermined solvent, the portion overlying the step being insufficiently exposed such that it remains soluble;
(g) developing the resist layer using the predetermined solvent, thereby removing the portion overlying the step; and
(h) removing the portion of the electrode material layer exposed by step (g) to define source and drain electrodes which extend over a respective one of the outer surfaces of the insulating layer to the step.

It may often be preferable to deposit the semiconductor layer before the electrode layer is deposited and patterned. For example, when using amorphous silicon, it is generally preferable to deposit it directly onto the insulating layer to provide a sound interface therebetween. However, in another preferred embodiment, step (c) of depositing the semiconductor layer is carried out after step (h). This is beneficial when using a semiconductor material which is not sufficiently resistant to the process used in step (h) to remove part of the electrode material layer. For example, polymeric semiconductors are not generally resistant to etchants likely to be used in patterning the electrode layer.

Preferably, the edge of the gate electrode is substantially normal to the insulating surface, resulting in a substantially vertical transistor channel. Nevertheless, it may be desirable to form the gate electrode edge at an angle to the substrate, forming a similarly angled transistor channel. It will be appreciated that in fabricating such a device according to the method of the invention, it will be necessary to adjust the angle of incidence of the radiation employed in step (e) so that the it is substantially aligned with the gate electrode edge.

A second thin film transistor may be formed simultaneously with the first thin film transistor at the edge of the gate electrode opposing the transistor channel of the first.

A low definition process may be used to define one or more, or all of the gate electrode and the other layers. As will be appreciated by the skilled person, photolithography is an example of a high definition process, whilst a low definition process may be a printing process such as gravure-offset printing, inkjet printing, or micro-dispensing. Photolithography requires the use of expensive vacuum equipment which has a relatively slow throughput. Low definition processes may often be achieved without the need for vacuum equipment. According to the method of the invention, the critical patterning step, that is the definition of the source and drain electrode spacing and therefore the TFT channel length, is achieved without the use of photolithography, and the use of vacuum equipment may be avoided. As the definition of the other TFT layers is generally less critical, it may be achieved with sufficient accuracy using relatively low cost, low definition processes. This particularly applies to AMLCDs with larger pixel sizes, such as a liquid crystal TV which may have a screen diagonal of greater than 20" (510 mm). In a 25" (635 mm) screen, a VGA display has a pixel size of 265×759 microns. In large pixels, the required channel aspect ratio, expressed as width divided by length, is large as well. Thus, the width of the channel may be defined by a relatively coarse definition process such as printing.

With printing techniques, materials are directly deposited in the required pattern, which avoids material wastage and may reduce the number of processing steps required. For example, resist materials may be printed onto layers of material deposited conventionally as a continuous blanket. Also, precursor materials may be printed onto a substrate and then converted into materials with the desired electrical properties by further processing steps.

The semiconductor material may comprise an organic, or more particularly, a polymeric material. These materials may be particularly suited to use in low definition processes such as printing or other low cost large area production techniques which may not require the use of expensive vacuum equipment, as they can be deposited in solution by techniques such as spin coating.

Preferably, the height of the upper surface of the gate electrode above the substrate is in the range of 0.05 to 1.5 microns. This in turn dictates the length of the transistor channel in the finished device.

Prior to the step of removing the portion of the electrode material layer exposed by the patterned resist layer, it may be advantageous to subject the resist layer to a reflow process and/or an ashing process, to improve the definition of the pattern in the resist layer.

An embodiment of the invention will now be described by way of example and with reference to the accompanying schematic drawings, wherein.

Figure 1:
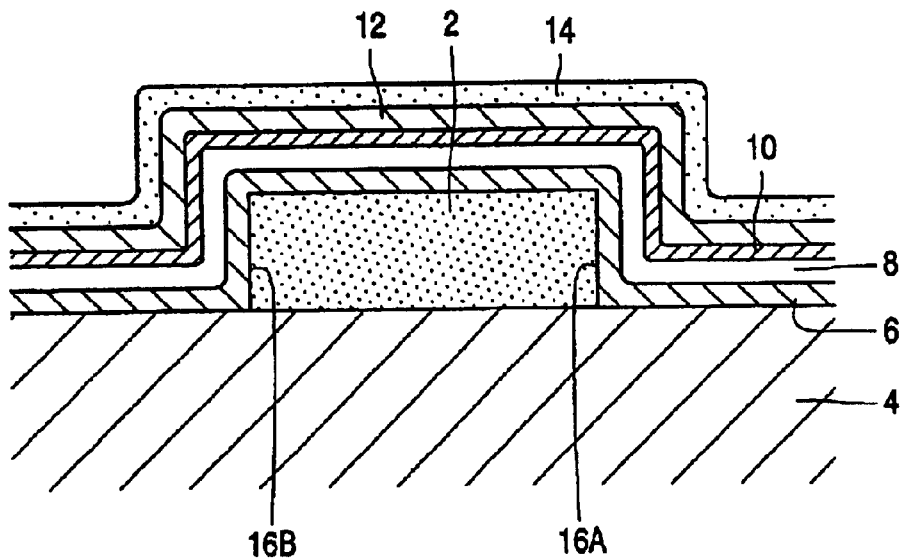
FIG. 1 illustrates a TFT structure in a first stage of preparation before irradiation of a resist layer.

It should be noted that the Figures are diagrammatic and not drawn to scale. Relative dimensions and proportions of parts of these Figures have been shown exaggerated or reduced in size, for the sake of clarity and convenience in the drawings.

FIG. 1 shows the first stage in the fabrication of a TFT according to a method embodying the invention. Firstly, the gate electrode 2 is provided on an insulating substrate 4. In an AMLCD for example, the insulating substrate may typically be formed of glass or a polymeric material, and the gate electrode of chromium. The gate electrode may be formed in a known manner by deposition of a layer of metal by sputtering, followed by a photolithographic patterning process. Alternatively, a printing process may be used.

The thickness of the gate electrode (that is, the height of its upper surface above the substrate) dictates the length of the transistor channel in the finished device. Typically, it may be around 1 micron, and may be varied from 0.05 up to 1.5 microns, for example. This lower value is dictated by current processing equipment, as it becomes difficult to reliably control the layer thickness below values of this order. At gate thickness around or above 1.5 microns, the time taken to sputter deposit the layer becomes increasingly significant and also as the channel length increases, the TFT switching speed reduces.

An insulating layer 6 is then deposited over the gate electrode 2 and also extends over a region of the substrate adjacent to the gate electrode. The insulating layer 6 may be a single layer of, for example, silicon nitride or it may comprise a number of layers of insulating material. It may be deposited by a known plasma enhanced chemical vapour deposition (PECVD) process to a thickness of around 300 nm.

A layer of semiconductor material 8, for example hydrogenated amorphous silicon, is formed over the insulating layer 6. An amorphous silicon layer may be provided using a known PECVD process, and may have a thickness of around 160 nm. A contact layer 10 is provided over the semiconductor layer 8, which may typically be formed of n+ doped silicon, deposited by a known PECVD process to a thickness of around 40 nm.

Next, a layer of electrode material 12 is defined over the contact layer 10. A suitable electrode material is a metal such as chromium for example. As with the gate electrode, this may be formed using a sputtering process. This is followed by a layer of negative resist 14. Each of the layers deposited over the gate electrode has a step therein corresponding to the edge 16A of the gate electrode.

Figure 2:
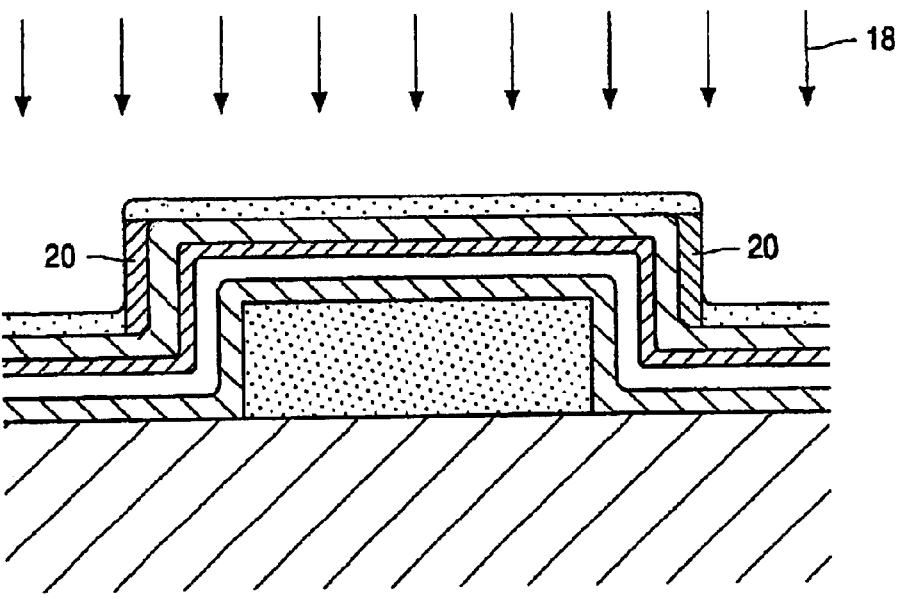
FIG. 2 illustrates a TFT structure in a second stage of preparation before during irradiation by a beam directed at a first angle.

As illustrated in FIG. 2, the negative resist 14 overlying the structure shown in FIG. 1 is then exposed to radiation 18 modifying the composition of the irradiated areas thereof. For example, using a resist consisting of Nano XP SU-8 2 made by MicroChem Corporation, this is achieved using ultraviolet light. The radiation is incident at an angle substantially normal to the substrate, such that a portion 20 (shaded in FIG. 2) of the resist overlying the step is substantially shadowed and not fully exposed owing to the relatively large normal thickness of the resist at the step in the layer.

Figure 3:
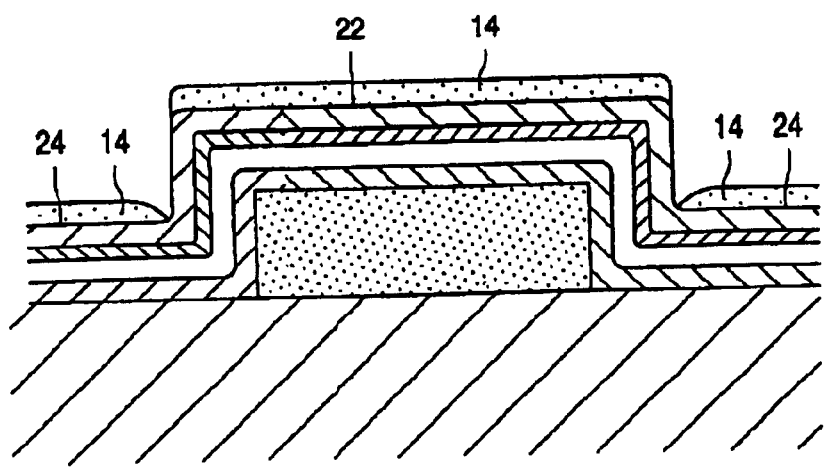
FIGS. 3 through 5 illustrate the development and further processing of the TFT structure as irradiated according to the embodiment of FIG. 2.

As a negative resist is used, the irradiated regions are rendered insoluble in a specific solvent, such as Microposit EC Solvent if Nano XP SU-8 2 resist is used, whilst the shadowed region remains soluble. The resist pattern can therefore be developed by immersing the structure in the solvent, removing portion 20 and retaining the remainder of the resist layer. The resist pattern may be improved by subjecting it to a reflow process after the development step. For example, with of Nano XP SU-8 2 resist, this may be achieved by heating at 150° C. for about 30 minutes. The reflow process reduces the amount of residual resist on the vertical step surface, and also on the horizontal surfaces adjacent the step. This results in a resist pattern as shown in FIG. 3 which extends over the upper and lower outer surfaces 22 and 24 of the electrode layer 12 up to the step. It may be desirable to improve the resist pattern further by ashing to remove excess resist overlying areas to be etched.

Using the remainder of the resist layer as a mask, the exposed portion of the electrode layer 12 and the underlying portion of the contact layer 10 are then removed, for example by an etching process. The resist material is then removed, to leave the finished TFT structure shown in FIG. 4. The remaining resist may be removed using a known stripper such as fuming nitric acid. Portions 26 and 28 of the electrode layer and the underlying contact layer extend over the semiconductor layer to the step, forming source and drain regions (respectively or vice versa). The length 30 of the transistor channel 32 in the underlying semiconductor layer 8 is defined therebetween.

Figure 4:
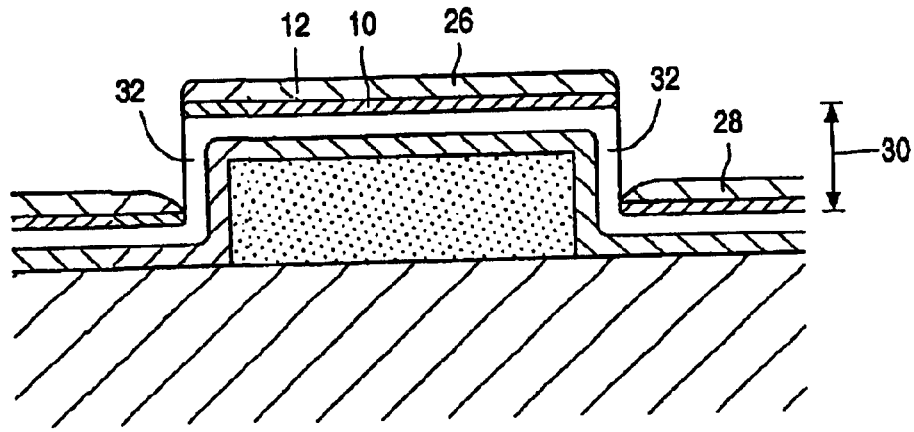
Figure 5:
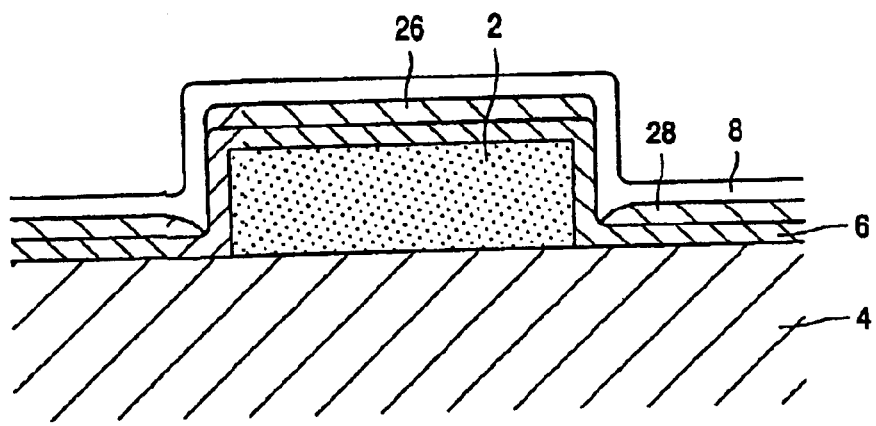

As an alternative to the process flow illustrated in FIGS. 1 to 4, the semiconductor layer 8 may be deposited after the electrodes 26 and 28 have been patterned, resulting in the TFT structure shown in FIG. 5. This may be a suitable approach when using a polymeric semiconductor material which is not sufficiently resistant to the etchant needed to pattern the electrode layer. In this embodiment, the contact layer 10 can be omitted. It may be less desirable when using amorphous silicon as the semiconductor material, as it may compromise the quality of the interface between the amorphous silicon and the insulating layer.

The configuration shown in FIGS. 4 and 5 is advantageous in that is has a relatively low electrode to gate capacitance for the portion 28 which overlies the substrate rather than any part of the gate electrode 2. In an AMLCD, it may therefore be preferable to connect this region to the pixel electrode, rather than region 26, as the kickback voltage of the respective pixel is dependent on the magnitude of the capacitance between the drain electrode of the TFT and the gate electrode.

Figure 2A:
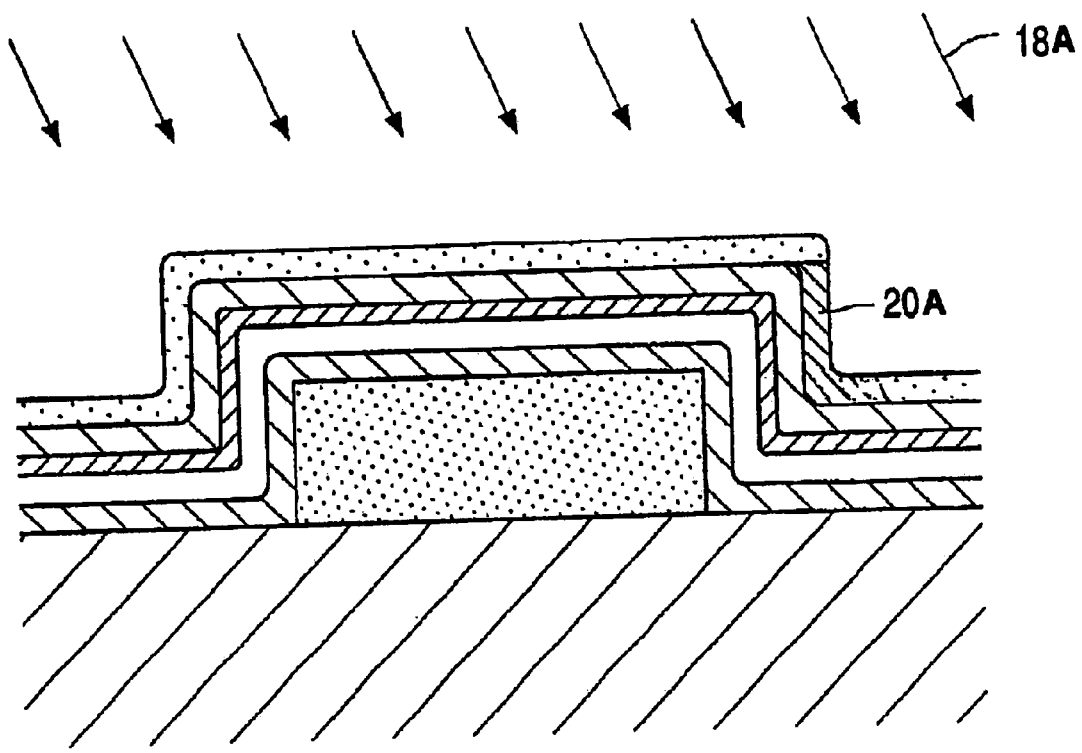
FIG. 2A illustrates a TFT structure in a second stage of preparation during irradiation by a beam directed at a second angle.

In FIGS. 1 to 5, the TFT formation process has been shown as creating a TFT structure alongside both opposing edges 16A and 16B of the gate electrode 2. The two structures thus simultaneously formed alongside the opposing edges 16A and 16B may be desirable in some applications. It may also be preferable to form a single such structure rather than two symmetrical structure, for example when fabricating an AMLCD. This may be achieved for example by altering the angle of incidence of the radiation 18A to which the negative resist is exposed such that only one edge 20A is shadowed as illustrated in FIG. 2A.

In the process described in relation to FIGS. 1 to 4, a single resist layer mask is used in the procedure of etching away both electrode layer 12 and contact layer 10 material. Alternatively, one mask may be formed in the manner described above over the contact layer 10 to mask etching of the contact layer material, and then the mask removed, an electrode layer deposited and a second mask formed in the same manner prior to etching of the electrode layer. This approach involves more process steps than the use of a single mask, but may be appropriate where different etchants are used in each etching process to provide a greater selectivity of the etchant between the layer to be etched and the underlying layer.

It will be appreciated that other semiconductor materials than amorphous silicon may be used to form the body of the transistor. For example, nanocrystalline silicon, polysilicon, II–VI semiconductors such as CdTe, III–V semiconductors such as GaAs could be employed. Also, organic semiconductors (such as pentacene) and more particularly polymeric semiconductors (such as poly 2,5-thienylene vinylene) may be preferred, and may allow flexible devices to be formed on a flexible substrate. Furthermore, organic-inorganic hybrid semiconductor materials may be used.

The TFT configurations described above are not only applicable to the field of AMLCDs, but also other applications, particularly where arrays of thin film devices are required such as in other large area electronic devices. Examples of these devices are active matrix polymer LED displays, or large area detectors, such as X-ray detectors for medical use or fingerprint sensors.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component parts thereof, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisaton thereof, whether or not it relates to the same invention as presently claimed in any Claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

What is claimed is:

1. A method of manufacturing an electronic device including a thin film transistor, comprising the steps of:
   (a) forming a gate structure including forming a gate electrode on an insulating surface;
   (b) depositing an insulating layer over the gate electrode and a region adjacent an edge of the gate electrode, such that the insulating layer comprises two first outer surfaces which are substantially parallel to, and mutually spaced normally of, the insulating surface with a step extending therebetween, said step forming a second outer surface forming an angle relative to said first two outer surfaces;
   (c) depositing a layer of semiconductor material on said first and second outer surfaces;
   (d) depositing a layer of electrode material on said first and second outer surfaces;
   (e) depositing a layer of negative resist material over the electrode material layer formed in step (e), the resist material being soluble in a predetermined solvent;
   (f) irradiating the resist layer using a beam at a predetermined angle, the surface of the resist overlying said two first outer surfaces being exposed more by said beam than the surface of the resist overlying the second outer surface due to said angle formed by said two first outer surfaces relative to said second outer surface, to render more exposed portions insoluble in the predetermined solvent, the portion overlying the step being insufficiently exposed such that it remains soluble, without the use of a mask to selectively block radiation from said reaching said portion overlying the step;
   (g) developing the resist layer using the predetermined solvent, thereby removing the portion overlying the step; and
   (h) removing the portion of the electrode material layer exposed by step (g) to define source and drain electrodes which extend over a respective one of the outer surfaces of the insulating layer to the step.

2. A method of claim 1 wherein step (c) of depositing the semiconductor layer is carried out after step (h).

3. A method of claim 1 wherein the edge of the gate electrode is substantially normal to the insulating surface.

4. A method of claim 1 wherein a second thin film transistor is formed simultaneously with the first thin film transistor at an opposing edge of the gate electrode.

5. A method of claim 1 wherein a low definition process is used to define one or more of the gate electrode and the layers.

6. A method of claim 5 wherein a low definition process is used to define the gate electrode and the layers.

7. A method of claim 1 wherein the semiconductor material comprises an organic material.

8. A method of claim 1 wherein the height of the upper surface of the gate electrode above the substrate is in the range of 0.05 to 1.5 microns.

9. A method of claim 1 including a further step after step (g) and before step (h) of subjecting the resist layer to a reflow process.

10. A method of claim 1 including a further step after step (g) and before step (h) of subjecting the resist layer to an ashing process.

11. A method of manufacturing an electronic device including a thin film transistor, comprising the steps of:
   forming a first gate structure on an insulating surface, said gate structure having non-parallel first and second faces, said first gate structure having an outer layer;
   forming a resist layer on said first gate structure such that said resist layer has non-parallel first and second faces overlying said gate structure first and second faces;
   irradiating said resist layer first and second faces from a direction and for a time interval such that said resist layer first face receives more radiation than said second face as a result of differing angles of incidence of radiation, such that the difference between the radiation received by said resist layer first and second faces causes a solubility property of said resist layer first and second faces to be different;
   developing to remove a portion of a one of said resist layer first and second faces rendered more soluble in said step of irradiating to expose an underlying portion of said gate structure outer layer without removing a portion of another of said resist layer first and second faces rendered less soluble in said step of irradiating.

12. The method of claim 11, further comprising the step of removing at least a portion said underlying portion to expose a portion of said gate structure outer layer.

13. The method of claim 11, wherein said resist layer is of negative resist material and said one of said resist layer first and second faces rendered more soluble in said step of irradiating includes said resist layer first face.

14. The method of claim 11, wherein said gate structure outer layer includes a layer of electrode material.

15. The method of claim 11, wherein said non-parallel first and second faces are substantially perpendicular.

16. The method of claim 11, wherein said step of irradiating includes irradiating with a beam having a substantially uniform direction of radiation.

17. A method of manufacturing an electronic device including a thin film transistor, comprising the steps of:
   forming structures on a substrate, each of said structures having at least one terminal portion;
   depositing a resist layer on said structures;
   irradiating said resist layer with a beam;
   developing said resist to remove a first portion thereof to expose said at least one terminal portion of each of said structures underlying said first portions; said steps of forming, depositing, and irradiating being such that said beam is incident on said first portions at first angles of incidence and on second portions of said resist layer at second angles of incidence such that said first portions receive a different amount of radiation than said second portions, said different amount causing said first portions to removed in said step of developing and causing said second portions to not be entirely removed in said step of developing, whereby selective regions of a resist are irradiated at least partly without the use of a separate mask.

18. The method of claim 17, wherein said step of irradiating includes irradiating with a beam having a uniform direction of radiation and a difference in said first and second angles of incidence results from a difference in angles of surfaces of said first and second portions relative to a plane of said substrate.

19. The method of claim 17, wherein said structure includes a gate.

20. The method of claim 17, wherein said step of depositing includes depositing said resist layer such that it has at least two outer surfaces which are substantially non-parallel.

* * * * *